United States Patent
Hung et al.

(10) Patent No.: US 8,258,540 B2
(45) Date of Patent: Sep. 4, 2012

(54) LED PACKAGE

(75) Inventors: Tzu-Chien Hung, Hsinchu Hsien (TW); Chia-Hui Shen, Hsinchu Hsien (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/069,393

(22) Filed: Mar. 23, 2011

(65) Prior Publication Data

US 2012/0056233 A1 Mar. 8, 2012

(30) Foreign Application Priority Data

Sep. 8, 2010 (CN) .......................... 2010 1 0272003

(51) Int. Cl.
*H01L 33/48* (2010.01)

(52) U.S. Cl. .......... 257/99; 257/100; 257/678; 257/712; 257/744; 257/E33.056

(58) Field of Classification Search .................... 257/99, 257/100, 678, 712, 774
See application file for complete search history.

(56) References Cited

U.S. PATENT DOCUMENTS

| 2005/0230818 A1* | 10/2005 | Ohno et al. .................... 257/707 |
| 2008/0096325 A1* | 4/2008 | Kao et al. ...................... 438/122 |
| 2011/0159282 A1* | 6/2011 | Kim et al. ...................... 428/344 |

FOREIGN PATENT DOCUMENTS

KR 2009126338 * 12/2009

* cited by examiner

*Primary Examiner* — Long Pham
(74) *Attorney, Agent, or Firm* — Altis Law Group, Inc.

(57) ABSTRACT

An LED package includes a base, an LED chip and an encapsulation. The LED chip is mounted on the base. The encapsulation encapsulates the LED chip. A heat dissipating plate is sandwiched between the LED chip and the base. The heat dissipating plate includes a first surface and a second surface. The LED chip is mounted on the first surface of the heat dissipating plate and has an interface engaging with the first surface of the heat dissipating plate. The first surface of the heat dissipating plate has an area greater than that of the interface. The second surface of the heat dissipating plate is attached to the base.

8 Claims, 3 Drawing Sheets

LED PACKAGE

BACKGROUND

1. Technical Field

The present disclosure relates generally to a light emitting diode (LED) package, and more particularly to an LED package which has an improved heat-dissipating characteristic.

2. Description of Related Art

Usually, an LED package includes a base and an LED chip mounted on the base, and the LED chip is attached to the base via die-attached epoxy. However, the die-attached epoxy has a relatively poor heat conductive characteristic, and heat generated by the LED chip can not be quickly transferred to the base. Thus, the LED package has a poor heat dissipating characteristic and a lifespan of the LED chip is shortened.

What is needed therefore is an LED package which can overcome the above limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
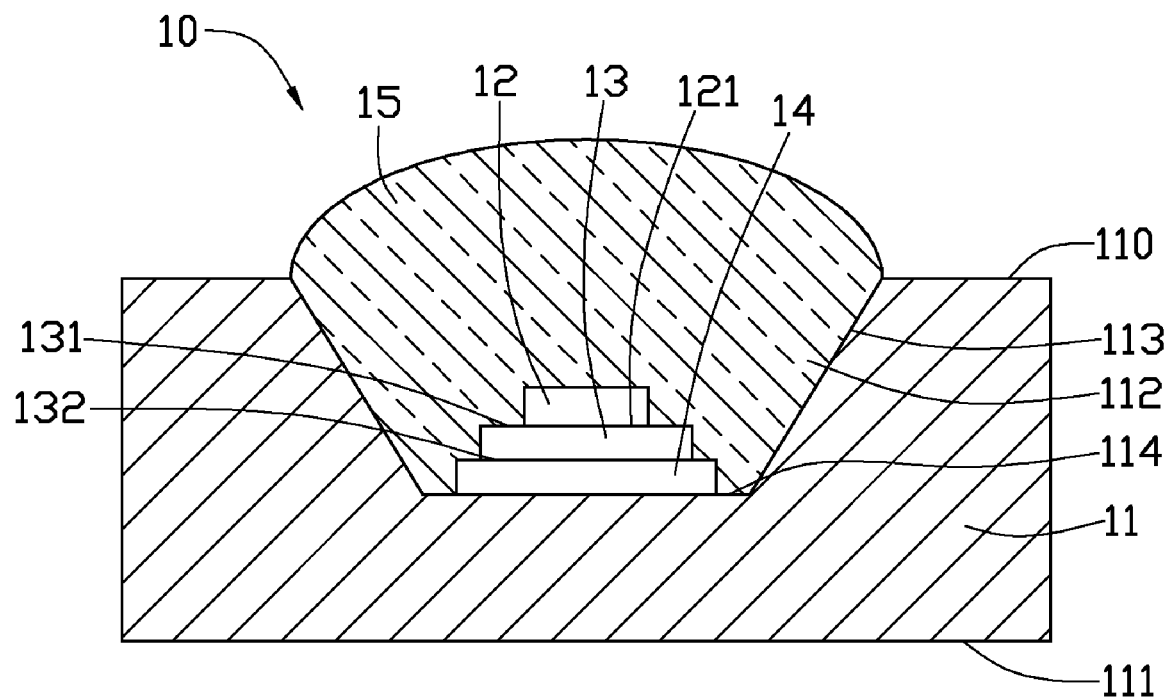
FIG. 1 is a cross-sectional view of an LED package in accordance with an embodiment of the present disclosure.

As shown in FIG. 1, an LED package 10 in accordance with an embodiment of the present disclosure includes a base 11, a heat dissipating plate 13, an LED chip 12 and an encapsulation 15.

The base 11 includes an upper surface 110 and a lower surface 111 opposite to the upper surface 110. The upper surface 110 of the base 11 defines a receiving recess 112 therein. The upper surface 110 of the base 11 forms an inner wall 113 circumferentially surrounding the receiving recess 112, and the upper surface 110 of the base 11 further forms a mounting surface 114 at a bottom of the receiving recess 112.

The heat dissipating plate 13 and the LED chip 12 are received in the receiving recess 112 of the base 11. The encapsulation 15 is filled in the receiving recess 112 of the base 11 and encapsulates the LED chip 12 and the heat dissipating plate 13.

The heat dissipating plate 13 is made of high heat dissipating material, for example silicon, ceramics or metal. The heat dissipating plate 13 includes a first surface 131 and a second surface 132 opposite to the first surface 131. The first surface 131 is located at a top side of the heat dissipation plate 13, and the second surface 132 is located at a bottom side of the heat dissipation plate 13. The second surface 132 is attached to the mounting surface 114 of the base 11 via an adhesive material 14 selected from one of die-attached epoxy and silver epoxy. The LED chip 12 is attached to the first surface 131 of the heat dissipating plate 13, and the LED chip 12 has an interface 121 engaging with the first surface 131 of the heat dissipating plate 13. The first surface 131 of the heat dissipating plate 13 has an area greater than that of the interface 121 of the LED chip 12. Preferably, the area of the first surface 131 of the heat dissipating plate 13 is greater than twice of that of the interface 121 of the LED chip 12.

When the heat dissipating plate 13 is made of silicon, the heat dissipating plate 13 and the LED chip 12 are bonded via metal bonding method. When the heat dissipating plate 13 is made of ceramics, the heat dissipating plate 13 and the LED chip 12 are bonded via one method selected from metal bonding, sol-gel method and coating. When the heat dissipating plate 13 is made of metal, the heat dissipating plate 13 and the LED chip 12 are bonded via one method selected from vapor deposition, electric deposition, chemical plating and metal bonding.

Heat generated by the LED chip 12 can be quickly transferred to the heat dissipating plate 13 since the heat dissipating plate 13 is bonded to the LED chip 12 and has a greater heat conductivity. And then, the heat can be quickly transferred from the heat dissipating plate 13 to the adhesive material 14, for the second surface 132 having a greater area and thus the heat dissipating plate 13 and the adhesive material 14 forming a greater heat exchanging area, even though the adhesive material 14 may have a relatively smaller heat conductivity than that of the heat dissipating plate 13. Eventually, the heat is transferred from the adhesive material 14 to the base 11. Thus, the LED package 10 has a greater heat dissipating efficiency and a lifespan of the LED package 10 can be extended.

Figure 2:
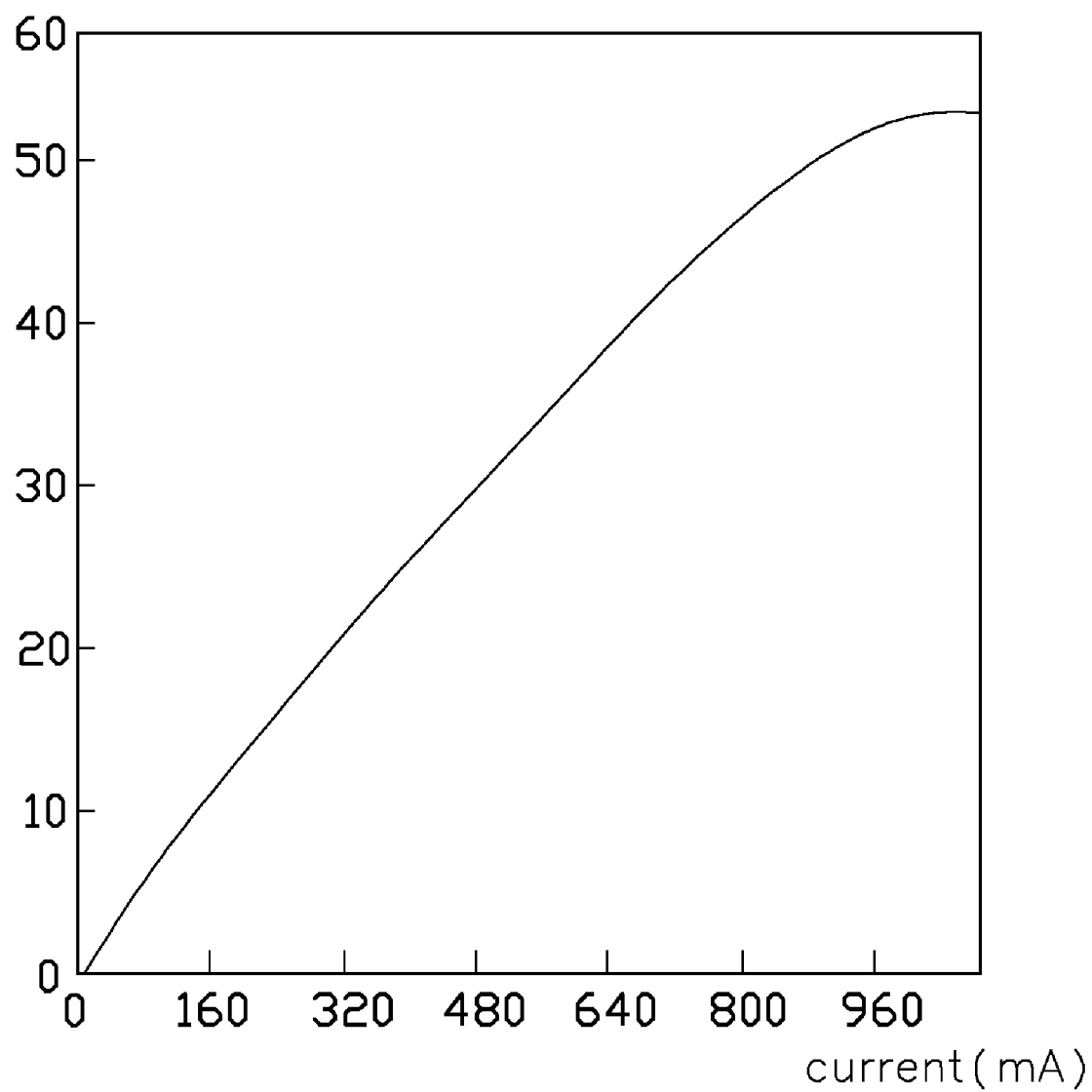
FIG. 2 is an intensity-current curve of the LED package in FIG. 1.
Figure 3:
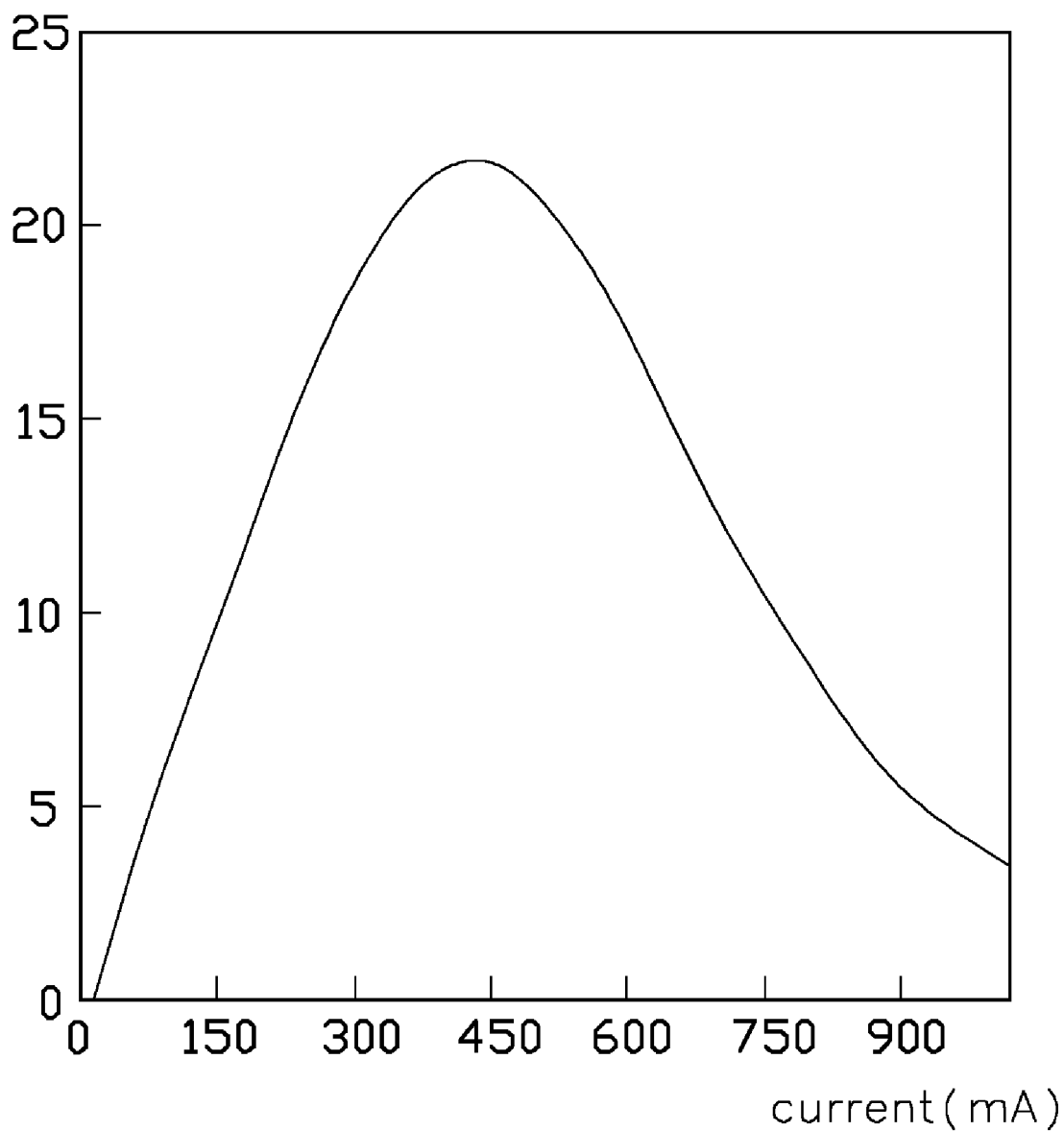
FIG. 3 is an intensity-current curve of a related LED package.

Referring to FIG. 2, an intensity and a saturation current of the LED package 10 of the present invention are 50 a.u. and 900 mA. Referring to FIG. 3, an intensity and a saturation current of the related LED package are 22 a.u. and 450 mA, which are much less than the present invention. This means that the LED package 10 in accordance with the present disclosure has a better heat dissipation performance than the related LED package. The LED package 10 for FIG. 2 has the interface 121 of the LED chip 12 with an area of 1 mm$^2$ and the heat dissipating plate 13 is made of copper (Cu) and the first surface 131 thereof has an area of 2.25 mm$^2$ The related LED package for FIG. 3 is substantially the same as the LED package 10 for FIG. 2, except that the related LED package does not have the heat dissipating plate 13 and the LED chip thereof is directly mounted on the adhesive material.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An LED package comprising:
   a base;
   a heat dissipating plate mounted on the base, the heat dissipating plate comprising a first surface and a second surface, the second surface attached to the base, the first surface being opposite to the second surface, wherein the heat dissipating plate and the base are connected together via a material selected from one of die-attached epoxy and silver epoxy; and
   an LED chip mounted on the first surface of the heat dissipating plate, the heat dissipating plate being located between the base and the LED chip, the LED chip having an interface attached to the first surface of the heat dissipating plate, the first surface of the heat dissipating plate having an area greater than that of the interface of the LED chip;

wherein the base defines a receiving recess therein, the base forming an inner surface circumferentially surrounding the receiving recess, the base forming a mounting surface at a bottom side of the receiving recess, the LED chip and the heat dissipating plate being entirely received in the receiving recess, the heat dissipating plate being mounted on the mounting surface of the base.

2. The LED package of claim 1, wherein the area of the first surface of the heat dissipating plate is greater than twice of that of the interface of the LED chip.

3. The LED package of claim 1, wherein the heat dissipating plate is made of ceramics.

4. The LED package of claim 3, wherein the heat dissipating plate is bonded to the LED chip by one of metal bonding, sol-gel method and coating.

5. The LED package of claim 1, wherein the heat dissipating plate is made of silicon, the heat dissipating plate being bonded to the LED chip by metal bonding.

6. The LED package of claim 1, wherein the heat dissipating plate is made of metal.

7. The LED package of claim 6, wherein the heat dissipating plate is bonded to the LED chip by one of vapor deposition, electric deposition, chemical plating and metal bonding.

8. The LED package of claim 1 further comprising an encapsulation, the encapsulation encapsulating the LED chip and the heat dissipating plate.

* * * * *